US007379161B2

(12) United States Patent
Almogy et al.

(10) Patent No.: US 7,379,161 B2
(45) Date of Patent: May 27, 2008

(54) PRINTER AND A METHOD FOR RECORDING A MULTI-LEVEL IMAGE

(75) Inventors: Gilad Almogy, Kiriat-Ono (IL); Haim Feldman, Nof-ayalon (IL); Meir Aloni, Hertslia (IL)

(73) Assignee: Applied Materials, Israel, Ltd., Rehovot (IL)

( * ) Notice: Subject to any disclaimer, the term of this patent is extended or adjusted under 35 U.S.C. 154(b) by 0 days.

(21) Appl. No.: 11/361,418

(22) Filed: Feb. 24, 2006

(65) Prior Publication Data

US 2006/0197931 A1 Sep. 7, 2006

Related U.S. Application Data

(62) Division of application No. 10/615,008, filed on Jul. 7, 2003, now Pat. No. 7,053,985.

(60) Provisional application No. 60/396,741, filed on Jul. 19, 2002.

(51) Int. Cl.
*G03B 27/54* (2006.01)
*G03B 27/42* (2006.01)

(52) U.S. Cl. .......................... 355/67; 355/53

(58) Field of Classification Search ................. 355/52, 355/53, 55, 67–71, 77; 356/399–401; 250/548, 250/492.2
See application file for complete search history.

(56) References Cited

U.S. PATENT DOCUMENTS

| 4,978,950 A | 12/1990 | Capps |
| 5,721,622 A | 2/1998 | Venkateswar |
| 5,724,092 A | 3/1998 | Davidson et al. |
| 5,936,713 A | 8/1999 | Paufler et al. |

(Continued)

FOREIGN PATENT DOCUMENTS

EP 1280007 1/2003

(Continued)

OTHER PUBLICATIONS

Search Report, "International Searching Authority", PCT/US03/21670, (Nov. 25, 2004).

*Primary Examiner*—Henry Hung Nguyen
(74) *Attorney, Agent, or Firm*—Tarek N. Fahmi

(57) ABSTRACT

A printer and method for recording a predefined multiple intensity level image on a substrate, the method includes the steps of: converting the predetermined image to multiple intensity level associated images; converting a light beam to multiple light beam arrays; modulating each light beam array to provide modulated light beam arrays, in response to a corresponding intensity level associated image to be recorded on the substrate; directing each modulated light beam array to impinge on the substrate; and repeating the steps of converting, modulating and directing while moving the substrate until the predefined image is imaged on the substrate. The printer includes a programmable optical radiation source for providing multiple modulated light beam arrays and for directing the modulated light beam arrays to impinge on the substrate, each modulated light beam array being modulated in response to an input signal corresponding to a corresponding intensity level associated image to be recorded on the substrate; whereas a superposition of the intensity level associated images forms the predefined image on the substrate, and a movable stage for moving the substrate until the predefined image is imaged on the substrate.

40 Claims, 10 Drawing Sheets

U.S. PATENT DOCUMENTS

| | | | |
|---|---|---|---|
| 6,133,986 A * | 10/2000 | Johnson | 355/67 |
| 6,177,980 B1 * | 1/2001 | Johnson | 355/67 |
| 6,301,000 B1 | 10/2001 | Johnson | |
| 6,407,766 B1 | 6/2002 | Ramanujan et al. | |
| 6,618,185 B2 | 9/2003 | Sandstrom | |
| 6,651,053 B1 | 11/2003 | Rothschild | |
| 6,765,934 B2 | 7/2004 | Gross | |
| 6,841,787 B2 * | 1/2005 | Almogy | 250/492.24 |
| 2002/0092993 A1 | 7/2002 | Kanatake et al. | |
| 2003/0035123 A1 | 2/2003 | Ramanujan et al. | |

FOREIGN PATENT DOCUMENTS

| | | |
|---|---|---|
| EP | 1316850 | 6/2003 |
| JP | 2001135562 | 5/2001 |

* cited by examiner

100'

PRINTER AND A METHOD FOR RECORDING A MULTI-LEVEL IMAGE

CROSS REFERENCES TO RELATED APPLICATIONS

The present patent application is a divisional application of U.S.Application Ser. No. 10/615,008 filed Jul. 7, 2003 which is now U.S. Pat. No. 7,053,985, which claims priority benefit from U.S. Provisional Application 60/396,741 filed Jul. 19, 2002.

FIELD OF THE INVENTION

The present invention refers to a maskless method and device for patterning high-resolution images directly on photolithographic layers with a massively parallel beam arrays. This device is intended for use in the fabrication of semiconductor devices, microelectronics, Microsystems, thin-film devices, flat screens, and the structuring of masks and substrates for microlithographic applications.

BACKGROUND OF THE INVENTION

Photolithography is a technique for transferring images onto semiconductor or other substrates. There are two fundamental types of photolithography systems. A first type, referred to as image-projection lithography, uses master patterns, referred to as masks or reticles, and a projection system for projecting the image on the mask on a substrate. A second type of system, referred to as a maskless or direct-write system, forms images directly onto the substrate by scanning (or "writing") beams of light on the substrate. Some maskless lithography systems and method use multiple beams for increasing throughput.

U.S. Pat. No. 6,133,986 of Johnson, U.S. Pat. No. 5,936,713 of Paufler et al., U.S. Pat. No. 5,691,541 of Ceglio et el., U.S. Pat. No. 5,900,637 of Smith, U.S. Pat. No. 6,312,134 of Jain et al., U.S. Pat. No. 6,493,867 of Mei et al., U.S patent application 2002/0153362 of Sandstorm et al., U.S. Pat. No. 6,399,261 of Sandstrom, and PCT application WO 00/42618 of Johnson are believed to provide an adequate description of the state of the art. These patents and patent applications are incorporated herein by reference.

Maskless lithography may use electrons, ions or electromagnetic radiation for writing on the substrate. In either case, modulators for modulating the writing signal intensities are needed. In case of electromagnetic radiation in the UV or visible wavelength region, each maskless lithography system includes a light modulator. Systems that utilize multiple light beams include a modulator that is capable of modulating many light beams simultaneously. There are two types of light modulator, the first one is reflective and the second is diffractive. Both include modulation elements, such as movable micro-mirrors that may be moved/manipulated such as to direct an incident light beam a certain direction. A common prior art modulator can turn each of its modulating elements "on" (the light beam is directed towards the substrate) or "off" (the light beam is reflected away from the substrate) and is referred to as a binary modulator. Such a modulator is manufactured by Texas Instruments and is known as DMD.

In many cases it is desired to perform multi-level modulation, as opposed to binary modulation. Multi level modulation allows producing pixels that have a large range of intermediate intensity values resulting from a selective combination of multiple intensity levels. The intermediate intensity values are usually referred to as gray level values. These gray level values can increase the resolution of the lithography system. In multi-level modulation each pixel may have R intensity values (where R is usually 4,8,16,32 or any power of two).

A first prior art method provides multi-level modulation by controlling the duration of the "on" state of each modulating element. Said modulation is also termed Pulse Width Modulation (PWM). Accordingly, higher pixel values result in longer "on" durations, and vice versa.

This prior art method greatly limits the throughput of the lithography system. As each modulating element has a certain response period T, the time that is required to modulate a single K-level pixel is K*T. For example, in a typical DMD the response period of a mirror is about 30 microseconds. Assuming that 256 gray levels are required then the pixel time is about eight microseconds, thus only about 130 frames can be recorded per second.

Another prior art method for providing multi-level modulation is described at U.S. Pat. No. 6,399,261 of Sandstrom, assigned to Micronic Laser Systems AB from Taby, Sweden. This patent describes a maskless lithography system that includes a light modulator that is able to perform analog signal based multi-level modulation. Each modulation element is driven by an analog signal and may provide multiple intensity levels. The modulator needs to be calibrated using an empirical calibration procedure whereas a series of test patterns are images and analyzed. The modulator is susceptible to manufacturing inaccuracies, modulator temperature. Micronic has recently presented a prototype of a 1 Mega-pixel analog spatial light modulator.

Electromagnetic radiation beams, such as light beams, may be characterized by their polarization. The electric field of a linearly polarized optical wave lies only in a single plane. The electric filed of a circularly polarized optical wave lies in two orthogonal planes and are phased shifted by a quarter wavelength (or an odd amount of quarter wavelengths) of the optical wave. Polarizing beam splitters divide an optical wave that has electric fields in two orthogonal planes into two orthogonally polarized optical waves. Phase retardation involves making an optical path length for one out of two orthogonal linear polarizations different than the other. Quarter wave retarders convert linearly polarized optical waves into circularly polarized optical waves and vice versa. Variable retarders are able to change their retardance and accordingly are able to change the relative phase shift between the electrical fields in two orthogonal planes, thus introducing a phase shift. Variable wave retarders may change their retardance between zero and a portion of a wavelength. Variable wave retarders are characterized by the maximal amount of phase shift they introduce. For example a half wavelength variable retarder is able to change its retardance between zero and half wavelength. Wave retarders such as but not limited to quarter wavelength retarder and polarizing beam splitters are known in the art.

There is a need to provide a high throughput system for facilitating high-speed multilevel modulation for improved mask making and wafer lithography.

SUMMARY OF THE INVENTION

Advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

The invention provides a method for recording a predefined multiple intensity level image on a substrate, the method includes the steps of: converting the predetermined image to multiple intensity level associated images; converting a light beam to multiple light beam arrays; modulating each light beam array to provide modulated light beam arrays, in response to a corresponding intensity level associated image to be recorded on the substrate; directing each modulated light beam array to impinge on the substrate; and repeating the steps of converting, modulating and directing while moving the substrate until the predefined image is imaged on the substrate.

The invention provides a method for recording a predefined multiple intensity level image on a substrate, the method includes the steps of: converting the predetermined image to multiple intensity level associated images; converting a light beam to a sequence of time spaced multiple light beam arrays; for each light beam array of the sequence, modulating the light beam to provide a modulated light beam array and directing the modulated light beam array to impinge on the substrate, whereas the modulation is responsive to an input signal corresponding to a corresponding intensity level associated image to be recorded on the substrate; and repeating the steps of converting, modulating and directing while moving the substrate until the predefined image is imaged on the substrate.

The invention provides a printer for recording a predefined multiple intensity level image on a substrate, the printer includes a programmable optical radiation source for providing sequences of time spaced modulated light beam arrays and for directing the sequences of modulated light beam arrays to impinge on the substrate, whereas each modulated light beam array being modulated in response to an input signal corresponding to a corresponding intensity level associated image to be recorded on the substrate; whereas a superposition of the intensity level associated images forms the predefined image on the substrate; and a movable stage for moving the substrate until the predefined image is imaged on the substrate.

The invention provides a printer for recording a predefined multiple intensity level image on a substrate, the printer includes a programmable optical radiation source for providing sequences of time spaced modulated light beam arrays and for directing the sequences of modulated light beam arrays to impinge on the substrate, whereas each modulated light beam array being modulated in response to an input signal corresponding to a corresponding intensity level associated image to be recorded on the substrate; whereas a superposition of the intensity level associated images forms the predefined image on the substrate; and a movable stage for moving the substrate until the predefined image is imaged on the substrate.

The invention provides a method for compensating for angular deviation of modulated light beams, the method includes the steps of: modulating a light beam array, by a light modulator, to provide a modulated light beam array, whereas the modulated light beam array comprises at least one angular deviated modulated light beam; converting, by first focusing optics, the at least one angular deviated modulated light beam to a corresponding spatial displaced light beam that propagates in parallel to a required optical axis; and focusing the spatial displaced light beam.

The invention provides a printer for recording a predefined image on a substrate, the printer includes a light modulator, for modulating a light beam array to provide a modulated light beam array; whereas the modulated light beam array comprises at least one angular deviated modulated light beam; first focusing optics, positioned such as to convert the at least one angular deviated modulated light beam to a corresponding spatial displaced light beam that propagates in parallel to a required optical axis; and second focusing optics, positioned such as to focus the spatial displaced light beam to a required foci of the second focusing optics.

BRIEF DESCRIPTION OF THE DRAWINGS

Reference is made to the attached drawings, wherein elements having the same reference numeral designations represent like elements throughout, and wherein.

DETAILED DESCRIPTION OF THE DRAWINGS

Programmable Optical Radiation Source—First Embodiment

Figure 1A:
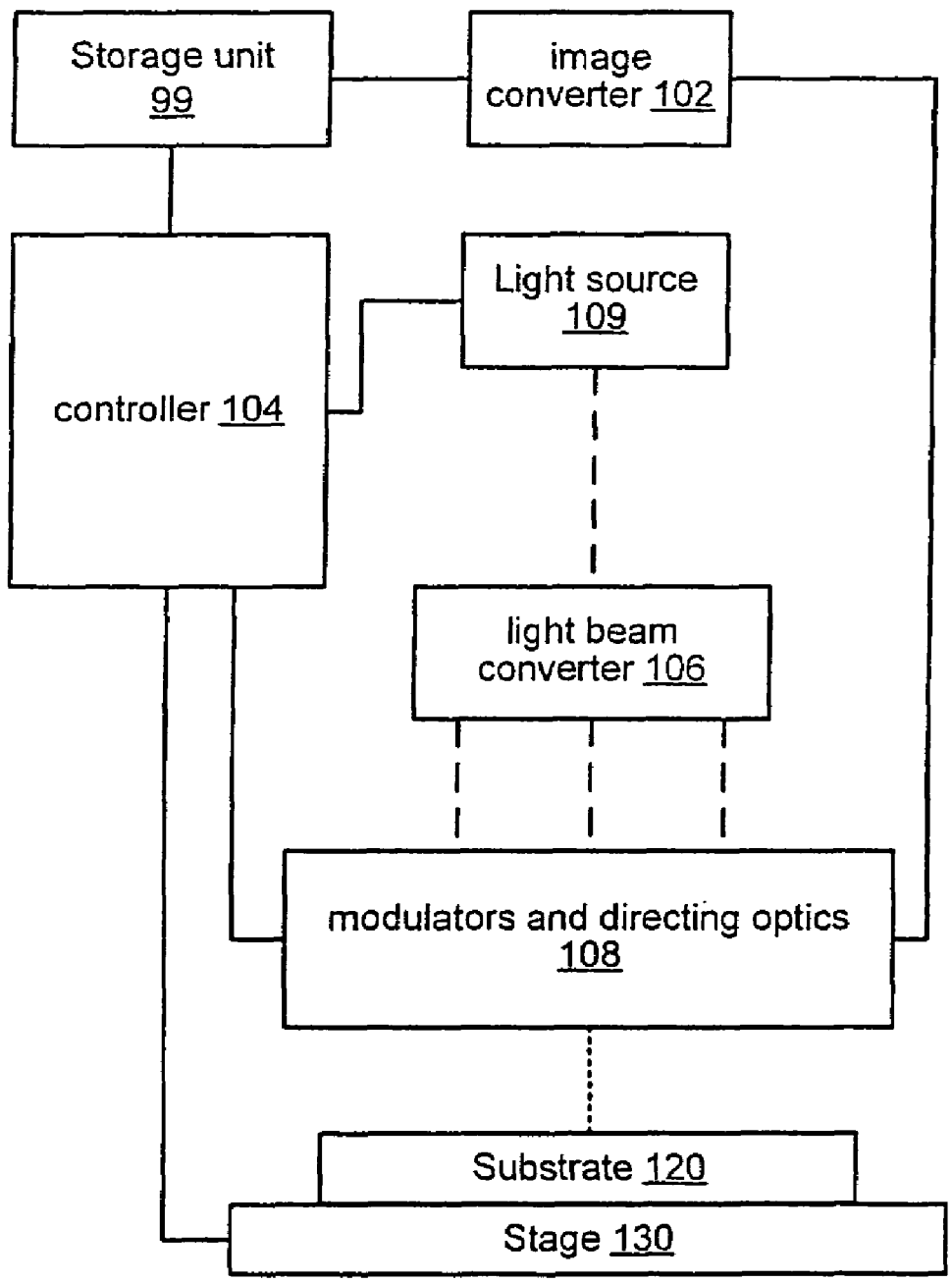
FIGS. 1a and 1b and 2a, 2b and 2c are conceptual diagrams of programmable optical radiation sources according to embodiments of the present invention.

FIG. 1a illustrates a programmable optical radiation source 100 according to an embodiment of the invention. Programmable optical radiation source 100 includes an image converter 102, a controller 104, light source 109, light beam converter 106, and modulators and directing optics 108. Image converter 102 is capable of retrieving a predetermined image from storage unit 99 and converting the predetermined image to be recorded on the substrate to multiple intensity level associated images, and may be embedded within controller 104. Controller 104 and/or image converter 102 control the modulators and the stage 130 for exposure of a desired pattern onto substrate 120.

Light beam converter 106 is positioned to receive a light beam (usually a pulsed light beam) from a light source, such as pulsed laser or continuous laser (both denoted 109) followed by blanking circuitry. It is noted that the modulators may be used to blank the light beam arrays between two consecutive pixels.

Light beam converter 106 is capable of converting the light beam to multiple light beam arrays. It is noted that a light beam array may also be a light ray that include multiple substantially parallel light rays.

Figure 1B:
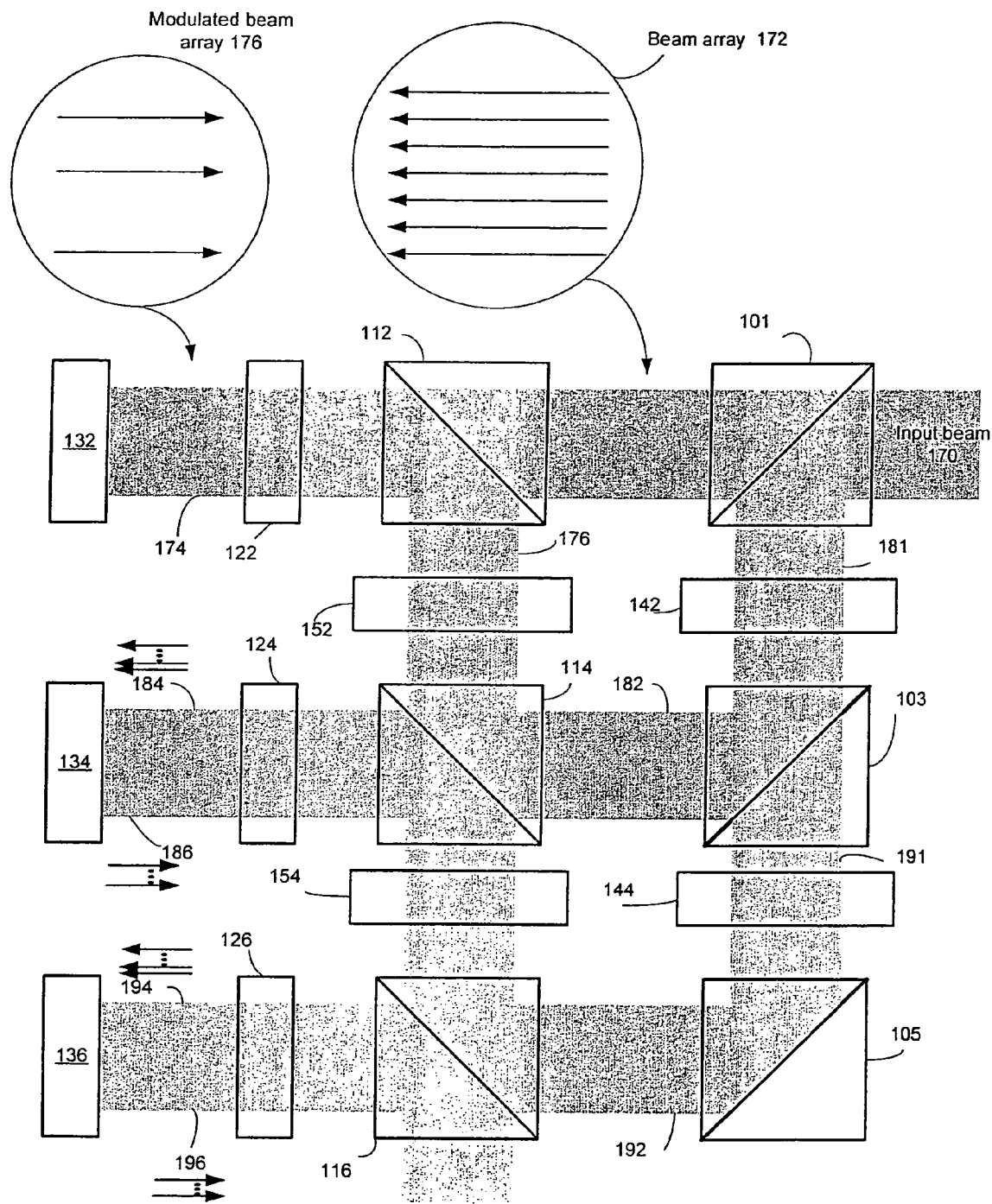

FIG. 1b illustrates a portion 100" of the programmable optical radiation source 100 of FIG. 1a. Portion 100" illustrates a light beam converter and modulators and directing optics. The light beam converter includes beam splitters 101, 103 and 105, polarizing beam splitters 112, 114 and 116, quarter wave plates 122, 124 and 126, and collimating optics (not shown) for providing a collimated light beam.

The modulators and directing optics are capable of providing modulated light beam arrays and for directing the modulated light beam arrays to impinge on the substrate. The modulators and directing optics includes modulators 132, 134 and 136, polarizing beam splitters 112, 114 and 116, quarter wave plates 122, 124 and 126, half wave plate 152 and half wavelength variable retarder 154.

Programmable optical radiation source 100, as well as portion 100" includes means for eliminating coherence between different modulated light beam arrays. These means include delay elements 142 and 144 that introduce a time shift between the generation of different modulated light beam arrays, such that different modulated light beam arrays do not propagate through the same optical element (such as a polarizing beam splitter) simultaneously. It is noted that coherence can be eliminated by manipulations in the frequency domain, such as by generating light beam arrays of different frequencies.

Each array of light beams corresponds to a certain, intensity level. A certain, modulator that receives input signals in response to a corresponding intensity level image modulates each such light beam array. The signals are also responsive to the scanning scheme, as multiple intermediate images are required to record a single intensity level associated image. According to one embodiment of the invention, a stepper type lithography is implemented. In such a scenario, each intermediate image "covers" a certain consecutive area of the pattern, and once a certain area is imaged, the system images another (usually not overlapping or slightly overlapping) area of the wafer. According to another embodiment of the invention, scanning type lithography is implemented. U.S. Pat. No. 6,133,986 of Johnson describes such a scanning scheme and is incorporated herein by reference.

Programmable optical radiation source 100 and especially portion 100" receive a light beam (of a limited duration T) and convert it to multiple light beam arrays 172, 182 and 192 that are directed towards modulators 132, 134 and 136. These three modulators allow eight intensity level modulation whereas modulator 132 corresponds to the highest intensity level I/2, modulator 134 corresponds to a lower intensity level I/4 and modulator 136 corresponds to the lowest intensity level I/8. Assuming that each modulator includes an array of NxN modulating elements then during each modulation cycle an array of NxN eight valued (three bit) pixels can be recorded, with only one bit (binary modulation) at each modulator out of modulators 132, 134 and 136.

Input light beam 170 is characterized by an intensity I—if it is directed towards the substrate it should illuminate the substrate with an intensity level I. An input light beam is split to two substantially equal light beams (each associated with intensity level I/2) 172 and 181. Light beam 172 is P-polarized and propagates through polarizing beam splitter 112 to be converted, by quarter wave plate 122 to a right circularly polarized light beam array 174 that in turn is directed towards binary modulator 132. Binary modulator 132 modulates light beam array 174 in response to modulation signals from image converter 101 to produce a left circularly polarized modulated light beam array 176 that is converted to S-polarized modulated beam array by quarter wave plate 122 to provide a S-polarized modulated beam array that is directed by polarizing beam splitter 112 towards half wave plate 152. Half wave plate 152 converts the S-polarized modulated beam array to an P-polarized modulated beam array than passes through polarizing beam splitter 114, half wavelength variable retarder 154 and polarizing beam splitter 116 towards the substrate to record an I/2 intensity level intermediate image. The variable retarder does not alter the polarization of this modulated light beam array.

Light beam 181 is delayed by delay element 142 such as to eliminate coherence effects between modulated light beam array 176 (resulting from light beam 172) and modulated light beam array 186 (resulting from light beam 182). Light beam 181 is split by beam splitter 103 to two I/4 intensity level light beams 182 and 191. Light beam 182 is P-polarized and propagates through polarizing beam splitter 114 to be converted, by quarter wave plate 124 to a right circularly polarized light beam array 184 that is directed towards binary modulator 134. Binary modulator 134 modulates light beam array 184 in response to modulation signals from image converter 102 to produce a left circularly polarized modulated light beam array 186 that is converted to S-polarized modulated beam array by quarter wave plate 124 to provide a S-polarized modulated beam array 186 that is directed by polarizing beam splitter 114 towards half wavelength variable retarder 154. Half wavelength variable retarder 154 converts the S-polarized modulated beam array 186 to a P-polarized modulated beam array that propagates through polarizing beam splitter 116 towards the substrate to record an I/4 intensity level intermediate image.

Light beam 191 is delayed by delay element 144 such as to eliminate coherence effects between modulated light beam array 186 (resulting from light beam 182) and modulated light beam array 196 (resulting from light beam 192). The delayed light beam is split by beam splitter 103 to provide an I/8 intensity level light beam 192. Light beam 192 is P-polarized and propagates through polarizing beam splitter 116 to be converted, by quarter wave plate 126 to a right circularly polarized light beam array 194 that is directed towards binary modulator 136. Binary modulator 136 modulates light beam array 194 in response to modulation signals from image converter 102 to produce a left circularly polarized modulated light beam array 196 that is converted to S-polarized modulated beam array by quarter wave plate 1.26 to provide a S-polarized modulated beam array that is directed by polarizing beam splitter 116 towards the substrate to record an I/8 intensity level intermediate image.

Programmable Optical Radiation Source—Second Embodiment

Figure 2A:
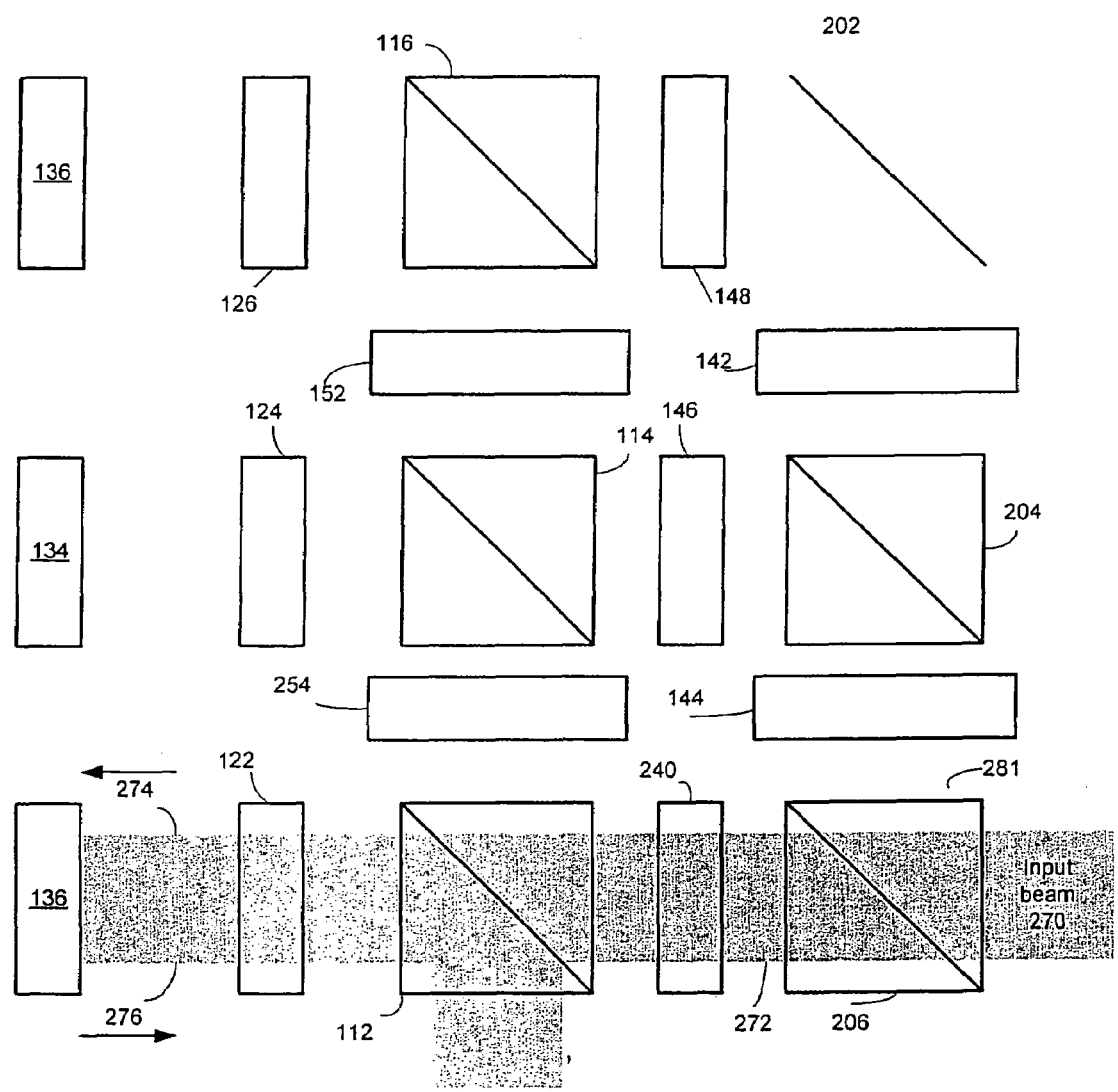
Figure 2B:
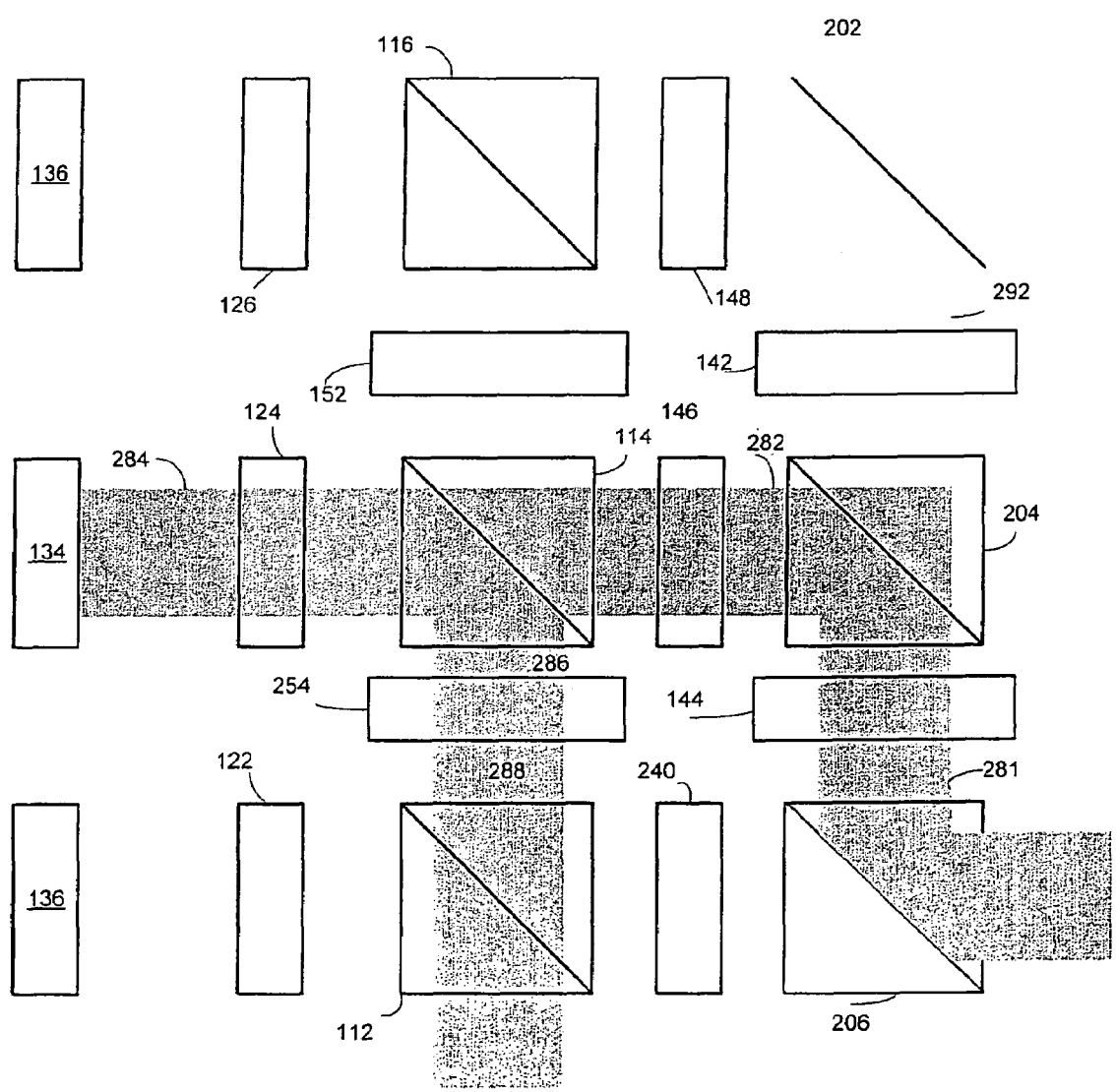
Figure 2C:
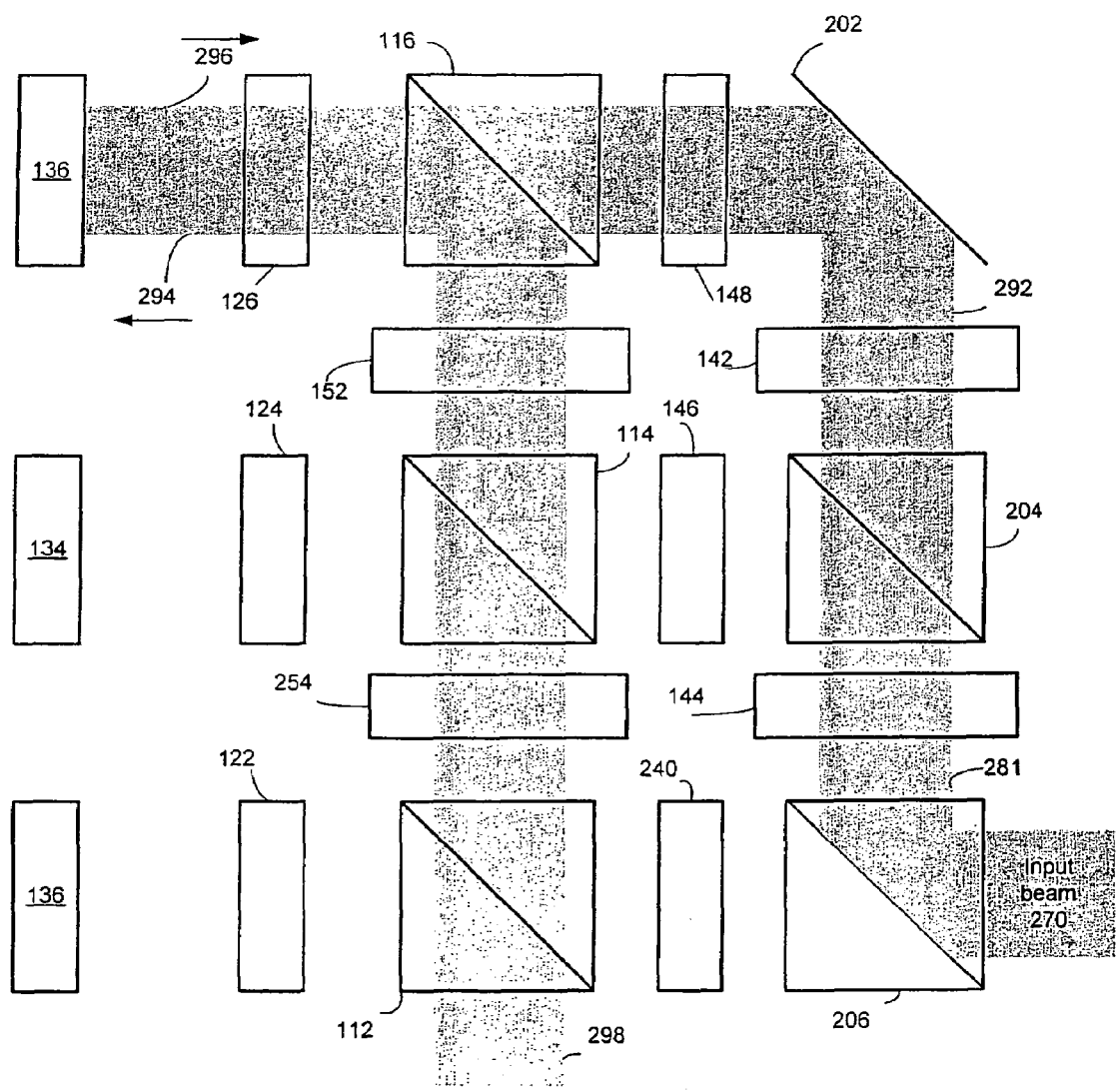

FIGS. 2a-c illustrates a portion 100' of a programmable optical radiation source 100 according to another embodiment of the invention. For convenience of explanation, each of said figures illustrates a path of a distinct light array. In each of these figures a forty-five degree retarder plate 254 replaces the half wavelength variable retarder 154 of source 100', and the light beam propagates through a different paths and is split in a different manner than in system 100'.

Input light beam 270 is characterized by an intensity IN and is split by beam splitter 206 to 0.4 IN intensity level beam 272 and to a 0.6 I intensity level light beam 281. Light beam 272 is P-polarized and propagates through delay element 240 and polarizing beam splitter 112 to be converted, by quarter wave plate 122 to a right circularly polarized light beam array 274 that is directed towards binary modulator 132. Binary modulator 132 modulates light beam array 274 in response to modulation signals from image converter 102 to produce a left circularly polarized modulated light beam array 276 that is directed by polarizing beam splitter 112 towards the substrate.

Light beam 281 is delayed by delay element 144 and is directed towards beam splitter 204 that split light beam 281 to 0.4 IN intensity level beam 282 and to a 0.2 IN intensity level light beam 292.

Light beam 282 is P-polarized and propagates through delay element 146 and polarizing beam splitter 114 to be converted, by quarter wave plate 124 to a right circularly polarized light beam array 284 that is directed towards binary modulator 134. Binary modulator 134 modulates light beam array 284 in response to modulation signals from image converter 102 to produce a left circularly polarized modulated light beam array 286 that is converted to S-polarized modulated beam array 286 by quarter wave plate 124. The S-polarized modulated beam array 286 is rotated by forty-five degrees by plate 254 to provide a linearly polarized modulated beam array that has equal S and P components. Said beam array is directed towards beam splitter 112 that passes only the P component of the modulated beam array, thus is provides an 0.2 IN intensity level modulated beam array 288.

Light beam 292 is P-polarized and propagates through delay element 142, mirror 202, delay element 148 and polarizing beam splitter 116 to be converted, by quarter wave plate 126 to a right circularly polarized light beam array 294 that is directed towards binary modulator 136. Binary modulator 136 modulates light beam array 294 in response to modulation signals from image converter 102 to produce a left circularly polarized modulated light beam array 296 that is converted to S-polarized modulated beam array (also referred to as 296) by quarter wave plate 126. The S-polarized modulated beam array 296 is directed by polarizing beam splitter 116 towards half wave plate 152. Half wave plate 152 converts the S-polarized modulated beam array to an P-polarized modulated beam array 296 that passes through polarizing beam splitter 114, to be rotated by forty-five degrees by plate 254 to provide a linearly polarized modulated beam array that has equal P and S components. It is noted that a quarter wave plate can replace plate 254. Said beam array 296 is directed towards beam splitter 112 that passes only the P component of the modulated beam array, thus is provides an 0.1 IN intensity level modulated beam array 298.

It is noted that the delay elements prevent coherence effects by introducing a delay that is larger than the pulse width.

It is further noted that coherence can be eliminated by using low coherence light source and/or by manipulations in the frequency domain.

Method for Recording Predefined Image—First Embodiment

Figure 3:
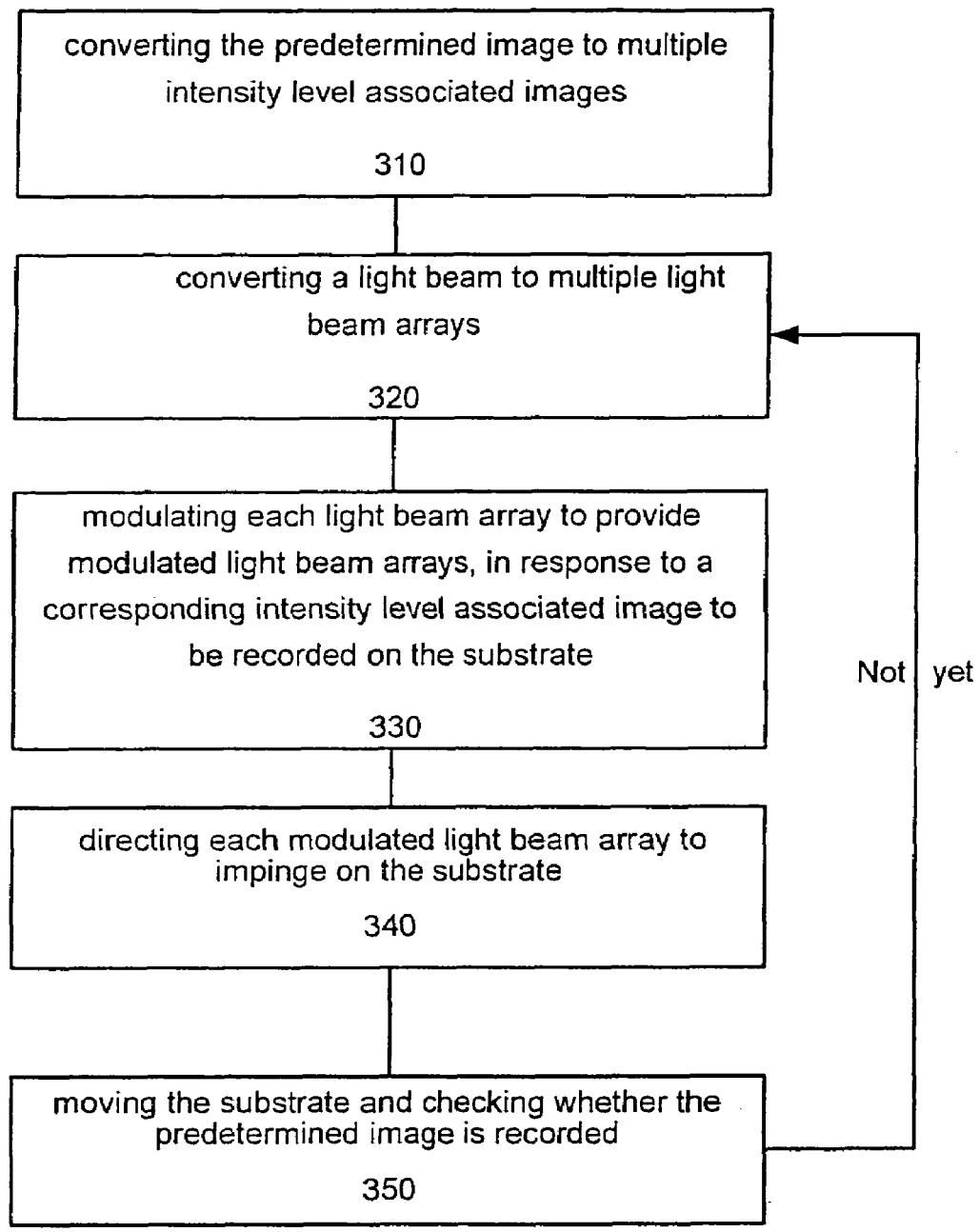
FIGS. 3 and 5 are flow charts illustrating methods for recording a predefined multiple intensity level image on a substrate, in accordance to embodiments of the invention.

FIG. 3 is a flow chart illustrating method 300 for recording a predefined multiple intensity level image on a substrate. Method 300 starts by step 310 of converting the predetermined image to multiple intensity level associated images. Assuming that the predefined image includes M×M pixels P(1,1)–P(M,M), each pixel P(j,k) has a multi-level value $PV(j,k)=a_1(j,k)*C_1+a_2(j,k)*C_2+ \ldots a_n(j,k)*C_n$. The predefined image is defined by a multilevel M×M bitmap. The predefined image is converted to n intensity level associated images, each including M×M elements and having values associated to a single coefficient out of $C_1 \ldots C_n$. For example, the first intensity level associated image includes $a_1(1,1)$–$a_1(M,M)$, whereas the n'th intensity level associated image includes $a_n(1,1)$–$a_n(M,M)$. The first intensity level image will be imaged on the substrate with an intensity that corresponds to $C_1$, while the n'th intensity level image will be imaged on the substrate with an intensity that corresponds to $C_n$. According to an aspect of the invention the coefficients equal power of two (1,2,4,8 and the like) but this is not necessarily so. It is further noted that in many cases only a portion of each intensity level associated image in printed during a single iteration of method 300. As mentioned above the intermediate image (the selection of bits which are imaged during a single iteration) is selected in response to the scanning/stepping of the modulated light beams. For example, in a scanning type lithography a modulated array of light forms a grid-array of spaced-apart spots while in a stepper type lithography the modulated light beam array form a continuous (depending upon the modulation) array of spots on the substrate. lithography type—stepper type lithography (in which or scanning lithography. As multiple scanning schemes may be selected the intermediate image must be responsive to the scanning scheme. A typical scanning scheme includes performing a raster scan of an area, while another scanning scheme include a tranalation of spaced apart spots.

Step 310 is followed by step 320 of converting a light beam to multiple light beam arrays. This step usually includes collimating the light beam to fit the cross section of the light beam to the dimensions of a light modulator. This step further includes splitting the light beam to multiple light beams, such that each modulator may receive a different light beam. Step 320 usually includes eliminating coherence between different modulated light beam arrays. The coherence may be eliminated by various measures, such as by introducing a time shift between said arrays, differentiating between arrays in the frequency domain, and the like. The intensity of the light beam arrays may be determined by said splitting but may also be altered during step 340, for example by using polarization to reduce the intensity of a light beam array.

Step 320 is followed by step 330 of modulating each light beam array to provide modulated light beam arrays, in response to a corresponding intensity level associated image to be recorded on the substrate. Step 330 may include directing the light beam array towards a reflective spatial modulator, altering a polarization state of at least the light beam array or the modulated light beam array reflected from the reflective spatial modulator, and/or focusing the modulated light beam arrays with an array of lenses after the modulating step. It is noted that diffractive and even transmissive modulators can implement the modulation.

Step 330 is followed by step 340 of directing each modulated light beam array to impinge on the substrate. As illustrated in greater details with reference to FIGS. 1a-1b and 2a-2c, step 340 may include directing each modulated light beam array via at least one polarizing beam splitter, altering the polarization of at least one modulated light beam array to enable said the at least one modulated light beam array to reach the substrate.

Step 340 may include compensating for movement of the substrate during time shifts introduced between different arrays. This compensation guarantees that the different intermediate images are aligned. This alignment can include retrograde scanning. U.S. Pat. No. 6,262,429 of Rishton et al. describes a scanning electron beam system that includes means for retrograde scanning. This method, as other prior art methods for retrograde scanning may be implemented. Alternatively, since the time shift is constant, a constant back-shift of the images can be introduced.

Step 340 is followed by step 350 of moving the substrate and checking whether the predetermined image was imaged—else repeating the steps of converting, modulating and directing while moving. As mentioned before, usually only a portion of the predefined image is printed during a single iteration of steps 320-340, accordingly these steps are repeated until the required image is printed. Step 350 may include a stepper type movement or scanning movement. For example, step 350 may include moving the substrate substantially linearly in a scanning direction that deviates from an axis of a modulated light beam array such that as the substrate is moved a distance substantially equal to a length of the array in the scanning direction, the modulated light beams trace a substantially continuous path on the substrate surface in a mechanical cross-scan direction. Step 350 may include moving the substrate on a movable stage in a direction slanted relative to the axes of the beam array. Step 350 may include flashing a certain area and then moving the substrate such that another area is illuminated during the next iteration of steps 320-340.

According to an embodiment of the invention step 330 includes focusing each light beam onto an element of a spatial light modulator, whereas each light beam is focused to a spot that are selectively imaged (in response to the modulation) onto the substrate, during step 340.

Method for Recording Predefined Image—Second Embodiment

Figure 4:
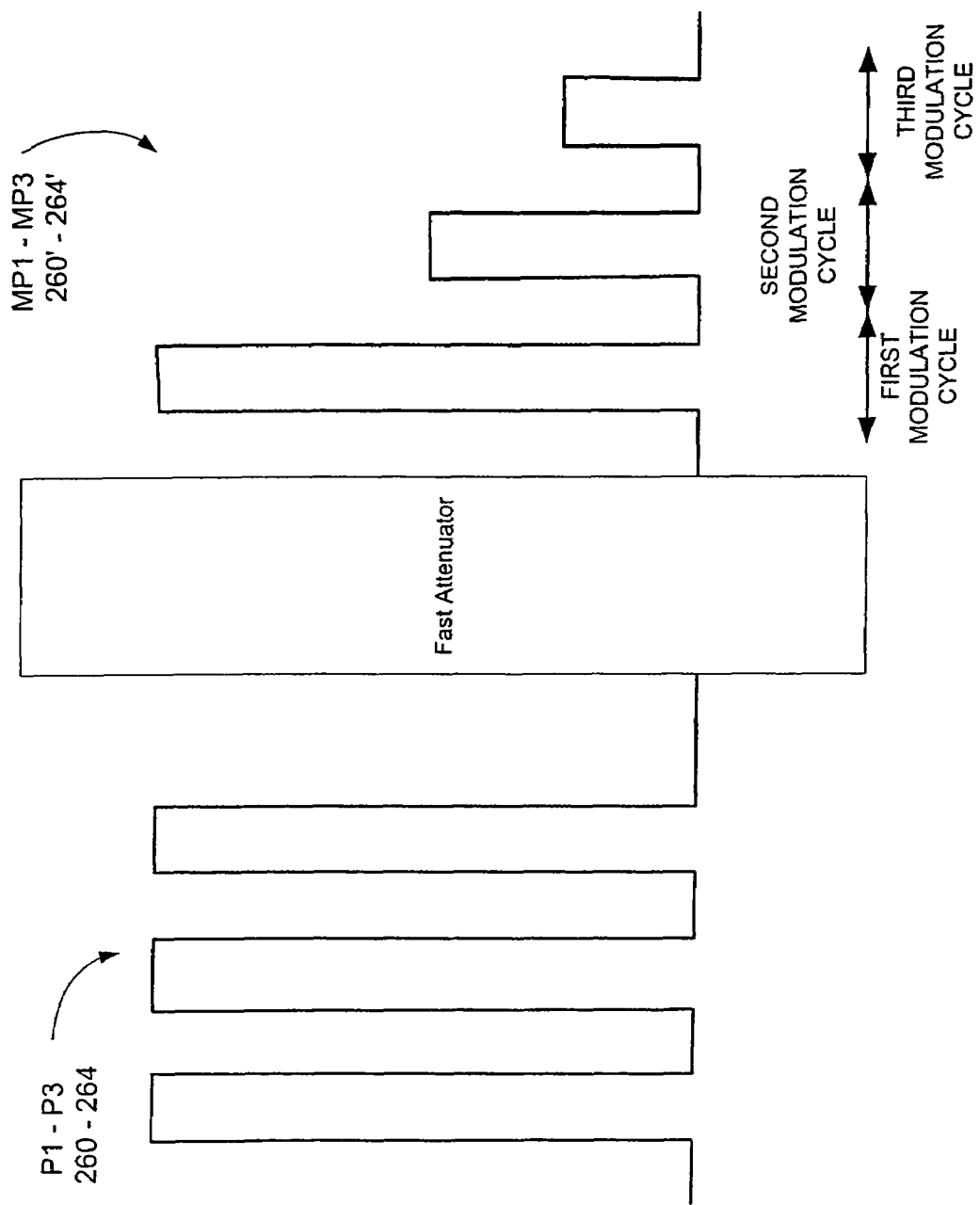
FIG. 4 illustrates a conversion of a light beam to a sequence of time spaced multiple light beam arrays, in accordance to an embodiment of the invention.

FIG. 4 illustrates a conversion of a light beam to a sequence of time spaced multiple light beam arrays, in accordance to an embodiment of the invention. According to this embodiment a pulsed light beam (or a series or equal intensity light beams, such as P1, P2 and P3 260-264) are converted to a series of light beams of different intensity (such as MP1-MP3 260'-264'). The intensity of the light beams can be further altered before impinging onto the substrate. Each light beam of the sequence of light beams is associated with a certain intensity level associated image. For example, a sequence of I intensity light beams are converted to a sequence of I, I/2 and I/4 Intensity light beams. The conversion involved a very fast attenuator, such as a Pockles cell and alike. These level modulated pluses are converted to light beam arrays that are modulated and directed towards a substrate.

According to an aspect of the invention the system may combine multiple modulators and level modulated pulses.

Figure 5:
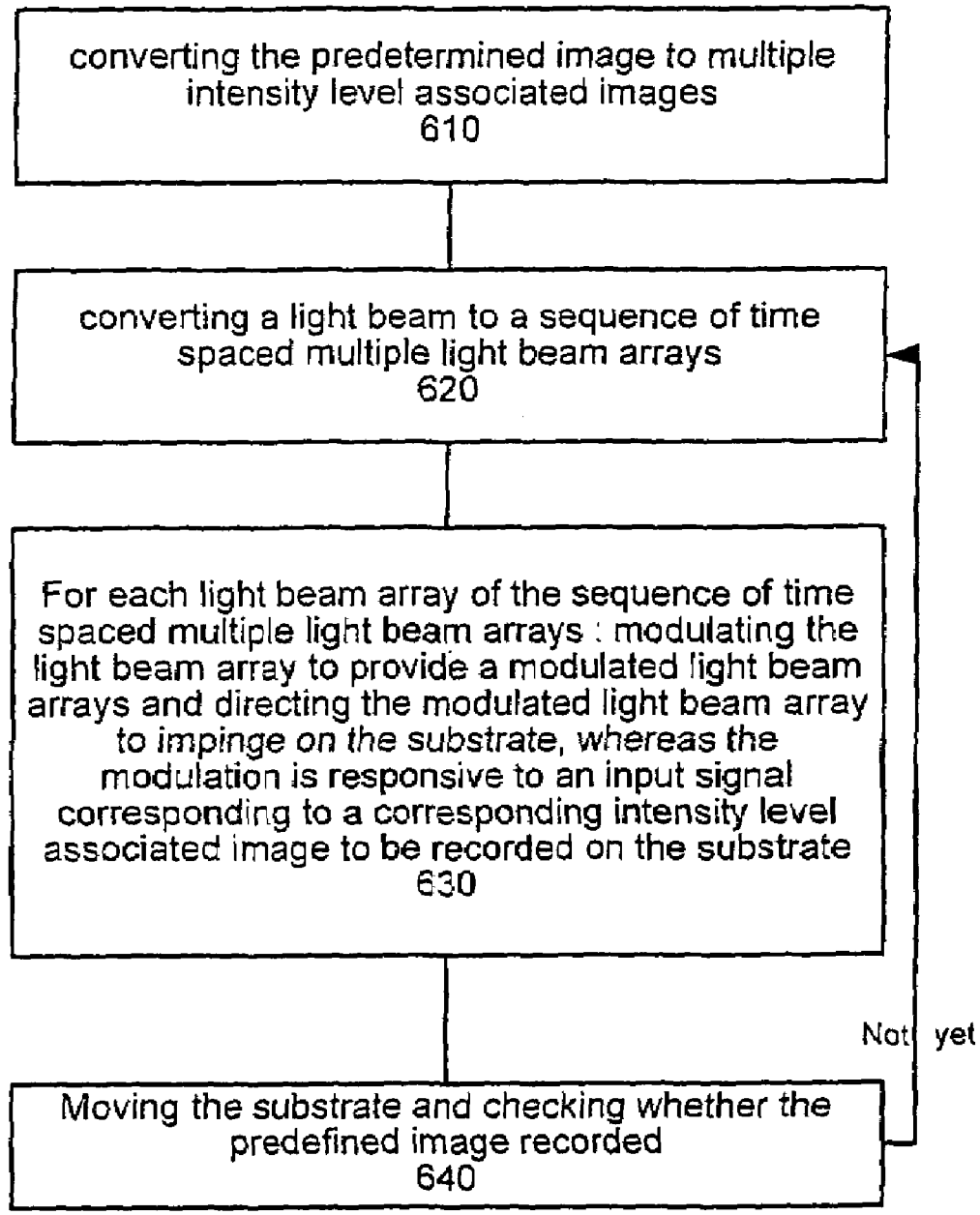

FIG. 5 is flow chart of method 600 for recording a predefined multiple intensity level image on a substrate. Method 600 starts by step 610 of converting the predetermined image to multiple intensity level associated images. Step 610 is followed by step 620 of converting a light beam to a sequence of time spaced multiple light beam arrays. Step 620 is followed by step 630 during which each light beam array of the sequence is modulated to provide a modulated light beam arrays and directing the modulated light beam array to impinge on the substrate, whereas the modulation is responsive to an input signal corresponding to a corresponding intensity level associated image to be recorded on the substrate. Step 630 is followed by step 640 of repeating the steps of converting, modulating and directing while moving the substrate until the predefined image is imaged on the substrate.

Printer for Recording Predefined Image

Figure 6:
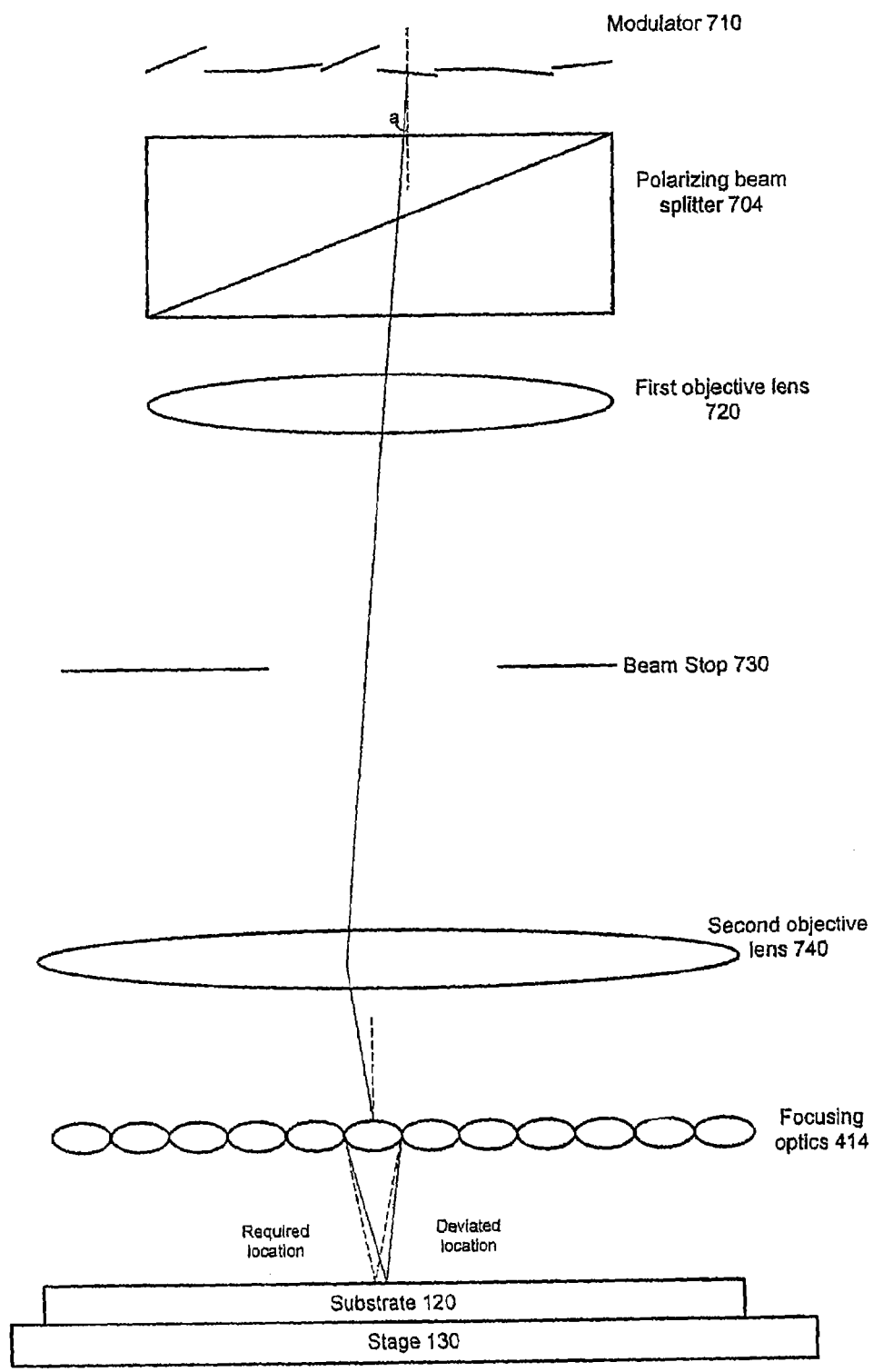
FIG. 6 illustrates a printer configured in accordance to an embodiment of the invention.

FIG. 6 illustrates a portion 700 of printer 10, in accordance to an embodiment of the invention. Portion 700 includes a spatial light modulator 710 that includes multiple micro-mirrors, said spatial light modulator 710 if followed by first objective lens 720, beam stop 730, second objective lens 740, first focusing optics 414 and substrate 120. It is noted that the printer may include multiple modulator and additional elements, and may be utilized for multi-level modulation as illustrated in any of the previous figures.

Polarizing beam splitter 704 may be analogues to any polarizing beam splitter of previous figures, such as 112, 114, 116 of FIG. 1b. It is positioned such as to direct a light beam array towards spatial light modulator 710, and to direct a modulated light beam array from spatial light modulator towards first objective lens 720. First focusing optics 414 provides a lens element for each beam of the modulated light beam array and focuses each beam onto a small spot on substrate 120 to form a grid-array of spaced-apart (when implementing a scanning type lithography) or continuous (when implementing stepper type lithography) spots on substrate 120.

Substrate 120 is supported on a stage 130, which provides relative movement between the modulated light beam arrays and substrate 120 to form a complete image on substrate 120 as it is translated through the beams in accordance with multiple-raster slanted-scan exposure strategy.

First focusing optics 414 comprises an array of microlenses which may either refractive or diffractive. For relatively low numerical apertures (NAs) and large fields of view (FOVs), plastic diffractive elements can be used. This allows for FOVs of many tens of centimeters across or even more. For high NA applications microlens arrays (typically tens of microns across) can be used. If diffractive lens elements are used, such as the Fresnel zone plate arrays described in U.S. Pat. No. 5,900,637, (referenced above) the lens array can further contain an aperture array (i.e., a pinhole array) to truncate the higher scattering orders created by the diffractive elements. Diffractive lenses are particularly suitable when used in conjunction with short wavelengths of light, such as extreme ultraviolet (EUV) of about 13 nm and are described more fully in the Smith article cited above.

First focusing optics 414 may be a single array of lenses, or multiple arrays arranged in series, as per conventional optical techniques, so the optical paths of the individual lens elements from the separate arrays form a compound lens. Such an arrangement results in arrays of compound lenses having a higher numerical aperture than can be obtained with arrays of single lenses. Such compound micro-lens arrays can be mechanically assembled by stacking individual lens arrays, or manufactured by, for example, well-known MEMS (micro-electro mechanical systems) manufacturing techniques.

Scanning Scheme

The scanning type lithography may include the use of a staggered multiple-raster slanted-scan pattern. The narrowed optical beams in the optical beam array scan substrate 120 along adjacent but staggered scan paths such that adjacent spots on substrate 120 are exposed at different times.

More specifically, substrate 120 is carried on mechanical stage 130, and translated in the y-direction. The array of beams 106 is slightly rotated (or "slanted") relative to the y-axis. The beam array is formed in a rectangular grid pattern in a number of rows and columns. Stage 130 is translated in the y-direction that results in each beam being scanned along a line parallel to the y-axis of the stage. The offsets of the beams across the x-axis of stage 130 is such that as substrate 120 is translated relative to the beam array in the scan direction y, the spots exposed by the beams leaves no gaps in the pattern on substrate 120. As the stage is further translated, the beams each expose spots in interlaced lines to fill in the complete image on substrate 120.

Movable stage 130 must be capable of providing accurate linear motion, such as can be obtained from a conventional interferometer-controlled stage with linear motors, commercially available from Anorad Corporation of New York.

Correction of Modulating Element Inaccuracies

According to an embodiment of the invention each modulator is preceded by a microlens array that focuses each light beam to a spot onto a modulating element. By positioning another parallel array of lenses in from of the substrate, the system compensates for inaccuracies in the orientation of modulating elements of the modulators.

The modulators include rotating micro-mirrors that change their orientation in response to modulation signals, such as to ideally direct light beams towards the substrate ("on" state) or away from the substrate ("off" state).

Position inaccuracies in a modulating element of spatial light modulator 710 result in an unwanted orientation of the reflected beam in response to the required optical axis of the reflected beam. Accordingly, the reflected light beam enters a corresponding microlens with an unwanted orientation. Said orientation causes the microlens to focus the beam at a spot that deviates from the foci of the microlens. Said deviation shall be less than few nanometers in order to allow accurate high resolution printing.

Figure 7:
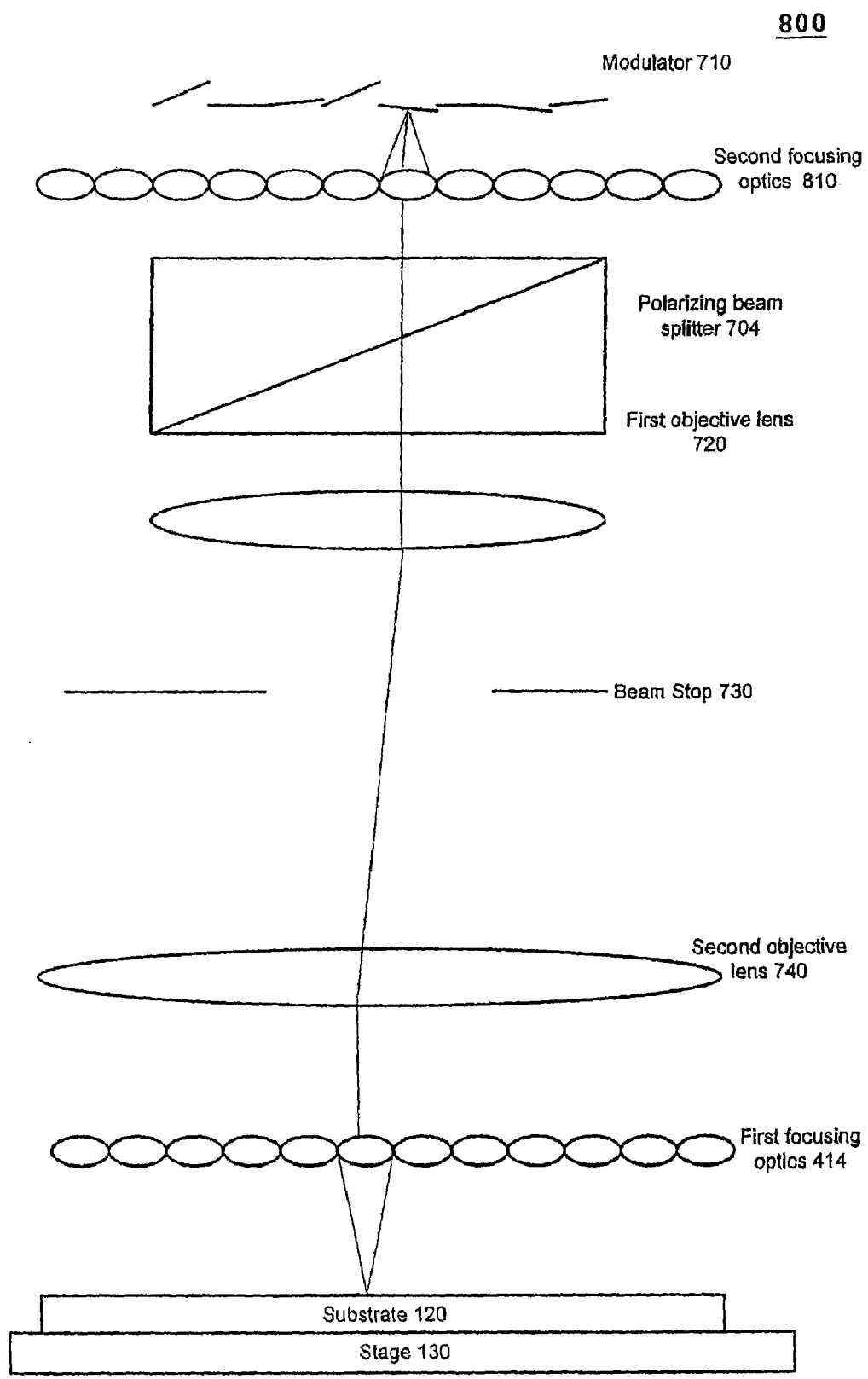
FIG. 7 is a cross sectional view of a portion of a printer.

FIG. 7 is a cross sectional view of a portion 800 of a printer, in accordance to an embodiment of the invention. Portion 800 includes polarizing beam splitter 704, spatial light modulator 710 that includes multiple micro-mirrors, second focusing optics 810 that is positioned between spatial light modulator 710 and beam splitter 704, whereas the polarizing beam splitter 704 is followed by first objective lens 720, beam stop 730, second objective lens 740, first focusing optics 414 and substrate 120.

In a certain sense, and although multiple optical elements (such as elements 720, 730 and 740) are positioned between the two focusing optics 414 and 810, these focusing optics form a telescope, whereas each focusing element (such as microlens) of the first focusing optics 414 corresponds to another focusing element of the other focusing optics 810.

Conveniently, the modulating elements are positioned at the focal plane of each of the microlens lenses of the second focusing optics 810, the second focusing optics 810 and the first objective lens 720 are spaced apart by the focal length Fa of the first objective lens 720, the first objective lens 720 and the beam stop 730 are spaced apart by Fa, the beam stop 730 and the second objective lens 740 are spaced apart by the focal length Fb of the second objective lens 740, the second objective lens 740 and the first focusing optics 414 are spaced apart by Fb. Substrate 120 is positioned at the focal plane of the first focusing optics 414.

Portion 800 overcomes orientation inaccuracies by the addition of second focusing optics 810 that is positioned such as to focus light beams onto the modulating elements and convert a reflected light beam that is oriented in response to the required optical axis to a light beam that is parallel to the optical axis. This parallel light beam is focused to the foci of a corresponding focusing element of the first focusing optics. Referring to FIG. 7, an oriented light beam passes through a microlens of the first focusing optics to propagate along an optical path that is perpendicular to the first focusing optics 414. A focusing element of the first focusing optics transforms said normal incident light beam to a spot onto substrate that is positioned below the center of said focusing optics.

The present invention can be practiced by employing conventional materials, methodology and components. Accordingly, the details of such materials, component and methodology are not set forth herein in detail. In the previous descriptions, numerous specific details are set forth, such as specific optical components, the amount of modulators, etc., in order to provide a thorough understanding of the present invention. However, it should be recognized that the present invention might be practiced without resorting to the details specifically set forth. For example, the amount of modulator may well exceed three, the ration between different intensity level may be other than two, and may change between different intensity levels.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A printer for recording a predefined image on a substrate, the printer comprising:
a programmable optical radiation source having means for converting the predefined image to a plurality of multiple intensity level associated images, means for converting a light beam to a plurality of multiple light beam arrays, each multiple light beam array having a different intensity, and reflective spatial modulators for modulating each light beam array to provide modulated light beam arrays in response to a corresponding intensity level associated image to be recorded on the substrate, wherein a superposition of the plurality of intensity level associated images forms the predefined image on the substrate;
means for directing each modulated light beam array to impinge on the substrate; and
a movable stage for moving the substrate until the predefined image is imaged on the substrate.

2. The printer of claim 1 wherein the programmable optical radiation source comprises means for eliminating coherence effects among different ones of the modulated light beam arrays.

3. The printer of claim 2 wherein the means for elimination coherence effects comprises delay for introducing time shifts among different ones of the modulated light beam arrays.

4. The printer of claim 3 further comprising means for compensating for movement of the substrate during the time shifts.

5. The printer of claim 2 further comprising a deflector for directing the modulated light beam arrays in a retrograde scan.

6. The printer of claim 2 wherein the means for eliminating coherence effects is selected from a group consisting of band pass filters and narrowband lasers.

7. The printer of claim 1 wherein the programmable optical radiation source comprises at least one polarizing beam splitter.

8. The printer of claim 1 wherein the programmable optical radiation source comprises polarization elements for altering the polarization of at least one modulated light beam array.

9. The printer of claim 1 wherein at least two of the plurality of multiple intensity level associated images have respective intensity levels differing from each other by a factor of two.

10. The printer of claim 1 wherein the programmable optical radiation source comprises polarizing elements for altering an intensity of at least one modulated light beam array by polarization.

11. The printer of claim 1 wherein the programmable optical radiation source comprises a light source for providing the light beam and light beam converters for converting the light beam to the plurality of multiple light beam arrays.

12. The printer of claim 1 further comprising polarizing elements for altering a polarization state of at least one of the light beam arrays and the modulated light beam array reflected from the reflective spatial modulator.

13. The printer of claim 1, further comprising an array of lenses for focusing the modulated light beam arrays onto corresponding spatial light modulators.

14. The printer of claim 1, wherein the movable stage is adapted to move the substrate substantially linearly in a scanning direction that deviates from an axis of a modulated light beam array so that as the substrate is moved a distance substantially equal to a length of the array in the scanning direction, the modulated light beams trace a substantially continuous path on the substrate surface in a mechanical cross-scan direction.

15. The printer of claim 1, wherein each modulated light beam array corresponds to an intermediate intensity level associated pattern on the substrate, and the superposition of the intermediate patterns forms the predefined image on the substrate.

16. The printer of claim 1 wherein the movable stage is adapted to move the substrate in a direction slanted relative to axes of the beam array.

17. The printer of claim 1 wherein the movable stage is adapted for iterative operation with the means for directing each modulated light beam array, so that the movable stage moves the substrate to provide for illumination of a substantially different continuous area of the substrate during each iterative operation of the directing means.

18. The printer of claim 1 wherein the light beam is generated by a pulsed laser.

19. The printer of claim 1 wherein the programmable optical radiation source comprises:
an image converter for converting the predefined image to multiple intensity level associated images;
a light beam converter, positioned to receive the light beam from light source, for converting the light beam to the multiple light beam arrays;
a controller, coupled to the image converter, the light beam converter, and to at least one spatial modulator, for controlling modulation of the multiple light beam arrays; and
at least one modulator and directing optics, for providing the modulated light beam arrays and for directing the modulated light beam arrays to impinge on the substrate.

20. A printer for recording a predefined image on a substrate, the printer comprising:
a programmable optical radiation source having means for converting the predefined image to a plurality of multiple intensity level associated images, means for converting a light beam to a sequence of time spaced multiple light beams arrays, and, for each light beam array of the sequence, means for modulating the light beam to provide a binary modulated light beam array and means for directing the modulated light beam array to impinge on the substrate, wherein each modulated light beam array is modulated in response to an input signal corresponding to a respective one of the intensity level associated images to be recorded on the substrate, and a superposition of the intensity level associated images forms the predefined image on the substrate; and
a movable stage for moving the substrate until the predefined image is imaged on the substrate.

21. The printer of claim 20 wherein the programmable optical radiation source comprises:
an image converter for converting the predefined image to multiple intensity level associated images;
a light beam converter, positioned to receive the light beam from a light source, for converting the light beam to the sequence of time spaced multiple light beam arrays;
a controller, coupled to the image converter, the light beam converter, and to at least one spatial light modulator, for controlling modulation of the multiple light beam arrays; and
at least one modulator and directing optics, for providing modulated light beams arrays and for directing the modulated light beam arrays to impinge on the substrate.

22. The printer of claim 20 further comprising means for compensating for movement of the substrate during the sequence of time spaced modulated light beam arrays.

23. The printer of claim 20 further comprising a deflector for directing the modulated light beam arrays in a retrograde scan.

24. The printer of claim 20 wherein the programmable optical radiation source comprises at least one polarizing beam splitter.

25. The printer of claim 20 wherein the programmable optical radiation source includes polarization elements for altering the polarization of at least one modulated light beam array.

26. The printer of claim 20 wherein at least two of the plurality of multiple intensity level associated images have respective intensity levels differing from each other by a factor of two.

27. The printer of claim 20 wherein the programmable optical radiation source comprises polarizing elements for altering an intensity of at least one modulated light beam array by polarization.

28. The printer of claim 20 wherein the programmable optical radiation source comprises a light source for providing the light beam and light beam converters for converting the light beam to the multiple light beam arrays.

29. The printer of claim 20 wherein the programmable optical radiation source comprises multiple reflective spatial modulators, each for modulating a single light beam array.

30. The printer of claim 29 further comprising polarizing elements for altering a polarization state of at least one of the light beam arrays and a corresponding modulated light beam array reflected from the reflective spatial modulator.

31. The printer of claim 20, further comprising an array of lenses for focusing the modulated light beam arrays onto corresponding spatial light modulators.

32. The printer of claim 20, wherein the movable stage is adapted to move the substrate substantially linearly in a scanning direction that deviates from an axis of a modulated light beam array so that as the substrate is moved a distance substantially equal to a length of the array in the scanning direction, the modulated light beams trace a substantially continuous path on the substrate surface in a mechanical cross-scan direction.

33. The printer of claim 20, wherein each modulated light beam array corresponds to an intermediate intensity level associated pattern on the substrate, and the superposition of the intermediate patterns form the predefined image on the substrate.

34. The printer of claim 20 wherein the movable stage is adapted to move the substrate in a direction slanted relative to axes of the beam array.

35. The printer of claim 20 wherein the movable stage is adapted for iterative operation with the means for directing each modulated light beam array, so that the movable stage moves the substrate to provide for illumination of a substantially different continuous area of the substrate during each iterative operation of the directing means.

36. The printer of claim 20 wherein the light beam is generated by a pulsed laser.

37. The printer of claim 1 further comprising a microlens array positioned between each modulator and the substrate, for converting a light beam, out of the modulated light beam array, that is oriented in relation to a required optical axis to a light beam that is parallel to the required optical axis and for focusing the converted light beam onto the substrate.

38. The printer of claim 1 further comprising a microlens array positioned between each modulator and the substrate, for focusing respective ones of the light beam arrays onto modulating elements, collecting respective modulated light beam arrays, and converting each modulated light beam array to multiple parallel light beams that propagate along an optical path normal to focusing optics capable of focusing each modulated light beam array onto the substrate.

39. The printer of claim 20 further comprising a microlens array between each modulator and the substrate, for converting a light beam, out of the modulated light beam array, that is oriented in relation to a required optical axis to a light beam that is parallel to the required optical axis and for focusing the converted light beam onto the substrate.

40. The printer of claim 20 further comprising a microlens array positioned between each modulator and the substrate, for focusing respective ones of the light beam arrays onto modulating elements, collecting respective modulated light beam arrays, and converting each modulated light beam array to multiple parallel light beams that propagate along an optical path normal to focusing optics capable of focusing each modulated light beam array onto the substrate.

* * * * *